(12) United States Patent
Albrecht

(10) Patent No.: US 9,297,869 B2
(45) Date of Patent: Mar. 29, 2016

(54) DEVICE FOR POWER MEASUREMENT AND MAGNETIC RESONANCE DEVICE

(71) Applicant: Adam Albrecht, Nuremberg (DE)

(72) Inventor: Adam Albrecht, Nuremberg (DE)

(73) Assignee: Siemens Aktiengesellschaft, München (DE)

( * ) Notice: Subject to any disclaimer, the term of this patent is extended or adjusted under 35 U.S.C. 154(b) by 671 days.

(21) Appl. No.: 13/622,926

(22) Filed: Sep. 19, 2012

(65) Prior Publication Data

US 2013/0069653 A1 Mar. 21, 2013

(30) Foreign Application Priority Data

Sep. 20, 2011 (DE) .................. 10 2011 083 066

(51) Int. Cl.
*G01R 33/28* (2006.01)
*G01R 19/00* (2006.01)
*G01R 33/36* (2006.01)

(52) U.S. Cl.
CPC .......... *G01R 33/3614* (2013.01); *G01R 33/288* (2013.01)

(58) Field of Classification Search
CPC ... G01R 33/288; G01R 33/3614; G01R 33/36
USPC ................. 324/300–322; 455/155.1, 522
See application file for complete search history.

(56) References Cited

U.S. PATENT DOCUMENTS

| 5,585,722 A * | 12/1996 | Hosoki ................. B82Y 35/00 324/300 |
| 8,648,596 B2 * | 2/2014 | Elliott ..................... G01N 24/08 324/316 |
| 2009/0128153 A1 | 5/2009 | Graesslin et al. |
| 2010/0141259 A1 * | 6/2010 | Graesslin et al. ............. 324/318 |
| 2010/0286686 A1 * | 11/2010 | Hancock ................ A61B 18/18 606/33 |

OTHER PUBLICATIONS

German Office Action dated Jun. 20, 2012 for corresponding German Patent Application No. DE 10 2011 083 066.9 with English translation.

* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

A device for power measurement for the purposes of plausibility checking and/or calibration of a primary power measurement device on a power amplifier of a magnetic resonance device is provided. The device includes a circulator arranged between an output of the power amplifier and a switching device for connection of the power amplifier to a transmit antenna. A first input of the circulator is connected to the output of the power amplifier, a second input of the circulator is connected to the switching device, and a third input of the circulator is connected to a secondary power measurement device configured for measurement of a signal reflected on the open switching device or the transmit antenna.

10 Claims, 1 Drawing Sheet

DEVICE FOR POWER MEASUREMENT AND MAGNETIC RESONANCE DEVICE

This application claims the benefit of DE 10 2011 083 066.9, filed on Sep. 20, 2011.

BACKGROUND

The present embodiments relate to a device for power measurement on a power amplifier of a magnetic resonance device.

In the case of a magnetic resonance device, a power amplifier may be employed in order to generate high frequency power to excite nuclear spin. For transmission, the power amplifier is coupled to a transmit antenna (e.g., a whole-body antenna), to which a switching device may be provided. If the antenna is also used as a receive antenna, the switching device may, for example, be embodied to couple the antenna optionally with the power amplifier and a receiver device.

For example, when a live patient is examined with the magnetic resonance device, but also if a loss check is to take place, a power measurement device may be employed for measurement of the forward power, which may be connected via a directional coupler downstream of the switching device. Whether the correct power is being radiated may be checked before the transmit antenna, and samplings in relation to a specific absorption rate (SAR) may be activated.

If samplings for SAR are also to be activated with the primary power device, the measured values of the primary power measurement device may be relied on. A secondary power measurement device between the output of the power amplifier and the switching device (e.g., directly downstream of the output of the power amplifier, which is linked via a directional coupler). Consistency checks may thus be performed between the measurements, or the primary power measurement device may be calibrated. It is known, for example, to carry out a calibration of the primary power measurement device at regular intervals.

SUMMARY AND DESCRIPTION

Connection of a secondary power measurement device via a directional coupler not only brings with it great space requirements, but also uses an additional calibration.

The present embodiments may obviate one or more of the drawbacks or limitations in the related art. For example, improved possibilities for arrangement of a power measurement device in terms of space requirements and interconnection are provided.

A device for power measurement (e.g., for the purposes of plausibility checking and/or calibration of a primary power measurement device) is provided on a power amplifier of a magnetic resonance device to solve this. The device includes a circulator arranged between an output of the power amplifier and a switching device for connection of the power amplifier to a transmit antenna. A first input of the circulator is connected to the output of the power amplifier, a second input of the circulator is connected to the switching device, and a third input of the circulator is connected to a secondary power measurement device embodied for measurement of a signal reflected on the open switching device or the transmit antenna.

In one embodiment, the primary power measurement device may be connected via a directional coupler downstream of the switching device (e.g., directly in front of the transmit antenna).

In one embodiment, a circulator that may also be used for a power measurement for a reflected power is employed. The circulator has the positive additional effect that the power amplifier is protected against reflected power. As in the case of a circulator with three connections, transmission is to the respective next connection, and the reflected signal is directed to the third output, to which the secondary power measurement device is then connected.

An arrangement of this type saves cost and build space, while the arrangement also offers the possibility of implementing additional functions. A test run of the power amplifier may be performed, as this may also be operated and measured with open switching device without power being fed back into the power amplifier. A self calibration may also be implemented in this way.

In another embodiment, the device further includes a controller that is embodied for plausibility checking and/or calibration of the power measurement for comparison of measured values of the primary power measurement device with closed switching device and the secondary power measurement device with open switching device. In this way, a simple possibility for plausibility checking and/or calibration is provided. A measurement of the signal reflected on the transmit antenna may be performed and examined in addition to the forward power measurement on the primary power measurement device. The switching device for measurement with the secondary power measurement device is not open but is kept closed, as reflected signals are also fed through the circulator to the secondary power measurement device. In the first case, for example, such measurements do not need to be performed constantly, but may, for example, be repeated on a cyclical basis.

In one embodiment, the primary power measurement device may be connected downstream of the switching device. The primary power measurement device is, for example, connected directly upstream of the transmit antenna, so that a suitable measuring point for measurement of a forward power output to the transmit antenna is provided.

The primary power measurement device may include a directional coupler. The primary power measurement device may thus be connected using a directional coupler. This is less problematic for the primary power measurement device, as more construction space may be available in that case.

In one embodiment, a magnetic resonance device with one embodiment of the device for power measurement is provided. All embodiments relating to the device may be transferred in an analogous manner to the embodiments of the magnetic resonance device, so that the advantages are also retained.

DETAILED DESCRIPTION OF THE DRAWINGS

Figure 1:
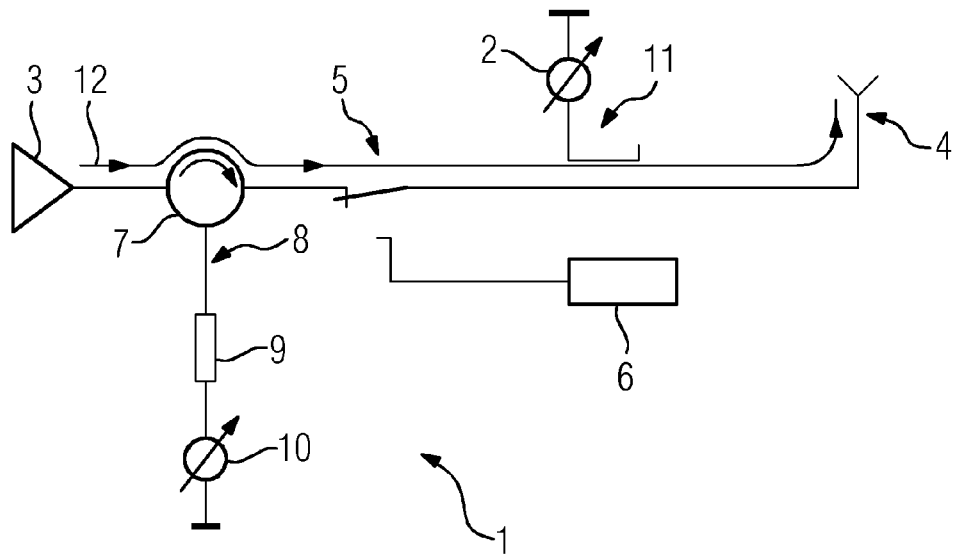
FIG. 1 shows one embodiment of a device with a closed switching device.

FIG. 1. shows a schematic diagram of one embodiment of a device 1 for plausibility checking and/or calibration of a primary power measurement device 2 that is arranged in a transmission path of a magnetic resonance device (e.g., between a power amplifier 3 that provides high frequency power and a transmit antenna 4 that is configured as a whole-body antenna and may also be operated as a receive antenna).

In order also to be able to use the transmit antenna 4 for reception, a switching device 5 is provided. Via the switching device 5, the transmit antenna 4 may optionally be connected to a receiver device 6. A position, in which no connection is present, may also be used.

A circulator 7 is connected between the switching device 5 and an output of the power amplifier 3. The circulator passes the signals to connections in a clockwise manner. Although a first connection of the circulator 7 is accordingly connected to the power amplifier 3, a second connection is connected to the switching device 5. Reflected power and thus, for example, reflected power also on the transmit antenna 4 or the switching device 5 are fed to a path 8 via a third connection, to which a secondary power measurement device 10 is connected via an impedance 9 that may, for example, be 50 Ohm.

The primary power measurement device, which is connected via a directional coupler 11, is connected between the switching device 5 and the transmit antenna 4 in order to measure a forward power.

FIG. 1 shows, on the basis of the arrow 12, the signal path of the forward power with a closed switching device 5 (e.g., one that connects the power amplifier 3 to the transmit antenna 4). The forward power may be measured with the primary power measurement device 2. The secondary power measurement device 10 measured the power reflected from the transmit antenna 4. The measurement data may be processed by a control device (e.g., a controller) that is not depicted in greater detail here. The reflected power may be measured for the purpose of establishing how much of the forward power measured is actually radiated. The circulator 7 protects the power amplifier 3 against the reflected power.

Figure 2:
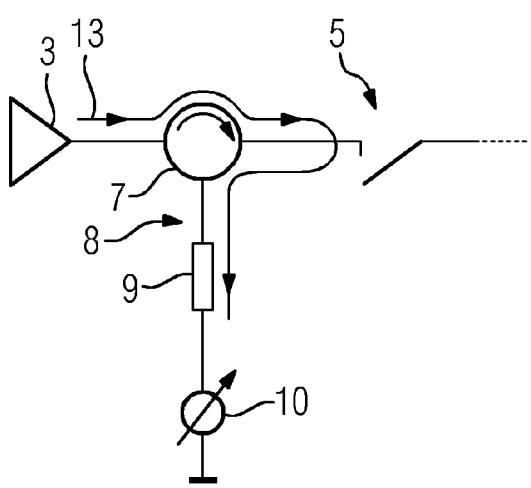
FIG. 2 shows one embodiment of a device with an open switching device.

This ability may be made use of in a special operating status, which is represented in FIG. 2. The switching device 5 is represented in an open form in FIG. 2, so that the entire signal (cf., 13) is reflected and reaches the secondary power measurement device 10 via the path 8. This operating state may be used for self testing of the power amplifier 3 and to determine a comparison value for plausibility checking of the measured values of the primary power measurement device 2 with closed switching device 5. This is an additional operating status that may be advantageously realized thanks to diversion via the circulator 7 and to the secondary power measurement device 10. Test, plausibility and calibration procedures, which make use of this operating status, may be performed by the controller, which is not represented in greater detail, and the measured values evaluated accordingly.

Figure 3:
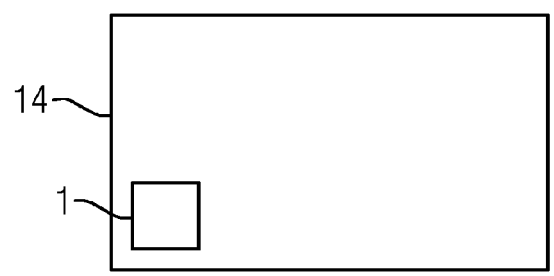
FIG. 3 shows one embodiment of a magnetic resonance device.

FIG. 3 shows the schematic diagram of one embodiment of a magnetic resonance device 14. Some components of the magnetic resonance device 14 are already known in the prior art, and need not be set out in greater detail. In the present case, a device 1 for power measurement according to FIGS. 1 and 2 is provided.

Although the invention has been illustrated and described in detail using the exemplary embodiment, the invention is not limited by the disclosed examples, and other variations may be derived by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for power measurement on a power amplifier of a magnetic resonance device, the device comprising:
    a circulator arranged between an output of the power amplifier and a switching device, the circulator operable for connection of the power amplifier to a transmit antenna, the circulator having a first input connected to the output of the power amplifier, a second input directly connected to the switching device, and a third input connected to a secondary power measurement device operable for measurement of a signal reflected on the switching device or the transmit antenna; and
    a primary power measurement device arranged between the switching device and the transmit antenna.

2. The device as claimed in claim 1, wherein the device is configured for plausibility checking, calibration of the primary power measurement device, or a combination thereof.

3. The device as claimed in claim 2, further comprising a controller configured for plausibility checking, calibration of the power measurement for a comparison of measured values of the primary power measurement device with the switching device, which is closed, and the secondary power measurement device with the switching device, which is open, or a combination thereof.

4. The device as claimed in claim 2, wherein the primary power measurement device comprises a directional coupler.

5. The device as claimed in claim 3, wherein the primary power measurement device comprises a directional coupler.

6. A magnetic resonance device comprising:
    a power amplifier;
    a transmit antenna; and
    a device for power measurement on the power amplifier, the device comprising:
        a circulator arranged between an output of the power amplifier and a switching device, the circulator operable for connection of the power amplifier to the transmit antenna, the circulator having a first input connected to the output of the power amplifier, a second input directly connected to the switching device, and a third input connected to a secondary power measurement device operable for measurement of a signal reflected on the switching device or the transmit antenna; and
        a primary power measurement device arranged between the switching device and the transmit antenna.

7. The magnetic resonance device as claimed in claim 6, wherein the device for power management on the power amplifier is configured for plausibility checking, calibration of the primary power measurement device, or a combination thereof.

8. The magnetic resonance device as claimed in claim 7, wherein the device for power management on the power amplifier further comprises a controller configured for plausibility checking, calibration of the power measurement for a comparison of measured values of the primary power measurement device with the switching device, which is closed, and the secondary power measurement device with the switching device, which is open, or a combination thereof.

9. The magnetic resonance device as claimed in claim 7, wherein the primary power measurement device comprises a directional coupler.

10. The magnetic resonance device as claimed in claim 8, wherein the primary power measurement device comprises a directional coupler.

\* \* \* \* \*